(12) United States Patent
Lee et al.

(10) Patent No.: US 7,601,469 B2
(45) Date of Patent: Oct. 13, 2009

(54) PLASMA ETCHING CHAMBER AND METHOD FOR MANUFACTURING PHOTOMASK USING THE SAME

(75) Inventors: Jeong-Yun Lee, Suwon (KR); Jin-Min Kim, Suwon (KR); Hae-Young Jeong, Suwon (KR); Young-Hwa No, Seoul (KR); Sang-Joon Yoon, Osan (KR); Sung-Yong Cho, Suwon (KR)

(73) Assignee: Samsung Electronics Co., Ltd., Suwon, Kyungki-Do (KR)

( * ) Notice: Subject to any disclaimer, the term of this patent is extended or adjusted under 35 U.S.C. 154(b) by 310 days.

(21) Appl. No.: 11/758,258

(22) Filed: Jun. 5, 2007

(65) Prior Publication Data

US 2007/0231716 A1   Oct. 4, 2007

Related U.S. Application Data

(62) Division of application No. 10/124,578, filed on Apr. 18, 2002, now abandoned.

(30) Foreign Application Priority Data

Apr. 24, 2001   (KR) .......................... 10-2001-22068

(51) Int. Cl.
   *G03F 1/00*   (2006.01)
   *G03F 7/26*   (2006.01)
(52) U.S. Cl. .......................................... 430/5; 430/330
(58) Field of Classification Search .................... 430/5, 430/322, 323, 330; 156/345.51, 345.52, 156/345.53
   See application file for complete search history.

(56) References Cited

U.S. PATENT DOCUMENTS

| | | | |
|---|---|---|---|
| 5,310,453 A | 5/1994 | Fukasawa et al. | |
| 5,534,072 A | 7/1996 | Mizuno et al. | |
| 6,432,833 B1 | 8/2002 | Ko | |
| 6,676,804 B1 | 1/2004 | Koshimizu et al. | |

FOREIGN PATENT DOCUMENTS

| | | |
|---|---|---|
| JP | 359098518 A | 6/1984 |
| JP | 63065631 A | 3/1988 |
| JP | 09063966 | 3/1990 |
| JP | 402106868 A | 4/1990 |

(Continued)

*Primary Examiner*—Stephen Rosasco
(74) *Attorney, Agent, or Firm*—Volentine & Whitt, PLLC (57) ABSTRACT

A plasma etching chamber of a plasma etching apparatus used in an etching process for manufacturing a photomask and a method for manufacturing a photomask using the same. The plasma etching chamber includes an electrode having a supporting surface for supporting a photomask substrate and a top surface surrounding the supporting surface, a heat transfer element installed along a peripheral edge of the supporting surface, and a heater for supplying heat to the heat transfer element. In the method for manufacturing a photomask, a shading layer is formed on a transparent substrate. A photoresist layer pattern is formed on the shading layer to partially expose the shading layer. The shading layer is etched to form a shading layer pattern, using plasma with the photoresist layer pattern as an etching mask, under a state in which the temperature of at least one portion of the peripheral edge of the transparent substrate is maintained higher than a temperature at a center of the transparent substrate.

8 Claims, 5 Drawing Sheets

FOREIGN PATENT DOCUMENTS

| | | |
|---|---|---|
| JP | 405074919 A | 3/1993 |
| JP | 11330214 | 11/1999 |
| JP | 2000036490 | 2/2000 |
| KR | 0125244 U | 4/1997 |
| KR | 2000-0000680 | 1/2000 |

PLASMA ETCHING CHAMBER AND METHOD FOR MANUFACTURING PHOTOMASK USING THE SAME

CROSS REFERENCES TO RELATED APPLICATIONS

This application is a divisional of U.S. patent application Ser. No. 10/124,578, filed on 18 Apr. 2002, which claims priority under 35 U.S.C. § 119 from Korean Patent Application No. 2001-22068, filed on 24 Apr. 2001, the contents of which are hereby incorporated by reference in their entirety for all purposes as if fully set forth herein.

BACKGROUND OF THE INVENTION

1. Field of the Invention

The present invention relates to a plasma etching chamber and a method for manufacturing a photomask using the same, and more particularly, to a plasma etching chamber of a plasma etching device used in an etching process for manufacturing a photomask and a method for manufacturing a photomask using the same.

2. Description of the Related Art

A photomask is typically used in a photolithographic process for manufacturing a semiconductor device, and the photomask may have various exposure patterns to achieve the desired result. To form a photomask having a desired exposure pattern, a shading layer is first formed on a photomask substrate, and a photoresist pattern is formed on the shading layer to expose a portion of the shading layer to create a shading layer pattern.

In general, photomask substrates are square-shaped. When the photoresist layer is formed on a square-shaped photomask substrate, a portion of the photoresist layer at the corners of the photomask substrate is thicker than a portion of the photoresist layer near the center of the photomask substrate. For example, in the case of forming an electron beam photoresist layer to a thickness of 3000 Å, the electron beam photoresist layer at the corners of the photomask substrate is about 200 Å thicker than the electron beam photoresist layer at the center of the photomask substrate.

Given this non-uniformity, after electron beam exposure and development are performed on the resultant substrate, the critical dimension (CD) of a portion close to the edge of the photomask substrate becomes smaller than that of a portion close to the center of the photomask substrate. Indeed, based on an after development inspection (ADI) performed after the photoresist layer pattern is formed to partially expose the shading layer on the photomask substrate, it has been noted that portions closer to the edge of the photomask substrate exhibit a smaller CD value.

Moreover, after the shading layer is etched by dry etching using the photoresist layer pattern as an etching mask, the difference in the CD among portions of the photomask substrate is even more pronounced. More specifically, the shading layer is etched to form a shading layer pattern, and then stripping and cleaning processes are performed on the resultant substrate. After that, an after cleaning inspection (ACI) is carried out. With reference to the ACI, the difference in the CD among portions of the shading layer pattern is more pronounced, because an etching rate for the shading layer at the center of the photomask substrate is relatively high, whereas an etching rate for the shading layer at the edge of the photomask substrate is relatively low.

As described above, if a photomask having a predetermined exposure pattern and exhibiting non-uniform CD distribution over an entire photomask substrate is used in the manufacture of semiconductor devices, various problems may occur, including performance degradation or inoperative devices.

SUMMARY OF THE INVENTION

To solve the above problems, it is a first object of the present invention to provide a plasma etching chamber used to perform an etching process for forming a shading layer pattern with a uniform CD distribution over an entire photomask substrate.

It is a second object of the present invention to provide a method for manufacturing a photomask including a shading layer pattern which has a uniform CD distribution over an entire photomask substrate.

Accordingly, to achieve the first object, the present invention provides a plasma etching chamber including an electrode having a supporting surface for supporting a photomask substrate, and a top surface surrounding the supporting surface. A heat transfer element is installed along the peripheral edge of the supporting surface, and a heater is provided to supply heat to the heat transfer element.

Preferably, the heat transfer element is built into the electrode itself. The heat transfer element may be partially exposed along the peripheral edge of the supporting surface and the top surface on the electrode.

When the supporting surface is stepped down from the top surface, the electrode may further include a side wall extending between the top surface and the supporting surface, and the heat transfer element may be partially exposed along the peripheral edge of the supporting surface, the side wall, and the top surface.

Alternatively, the heat transfer element may be built into the electrode so that it is not exposed on the top surface of the electrode.

In another aspect, the present invention provides a plasma etching chamber including an electrode, including a supporting surface for supporting a photomask substrate and a top surface surrounding the supporting surface. A chucking pad has a contact surface in contact with the corners of the photomask substrate and fixes the photomask substrate which is supported by the supporting surface. A heat transfer element is installed at the chucking pad to heat the corners of the photomask substrate, and a heater supplies heat to the heat transfer element. Preferably, the heat transfer element is built into the chucking pad.

To achieve the second object, the present invention provides a method for manufacturing a photomask, in which a shading layer is first formed on a transparent substrate. A photoresist layer pattern is formed on the shading layer so as to partially expose the shading layer. The shading layer is etched using plasma and using the photoresist layer pattern as an etching mask under a state in which at least one portion of the peripheral edge of the transparent substrate is maintained at a temperature higher than the temperature of the center of the transparent substrate.

During the step of etching the shading layer, the peripheral edge of the transparent substrate may be uniformly heated in order to maintain the temperature of the edge of the transparent substrate higher than the temperature of the center of the transparent substrate. Alternatively, the heat may be applied to the bottom edge of the transparent substrate in order to heat the edge of the transparent substrate. In another alternative, heat may be applied to the bottom edge and side walls of the transparent substrate in order to the heat the edge of the transparent substrate. A heat transfer element installed along the edge of the transparent substrate, and a heater for supplying heat to the heat transfer element, may be used for uniformly heating the edge of the transparent substrate.

Also, during the step of etching the shading layer, the corners of the transparent substrate may be heated in order to maintain the temperature of the corners of the transparent substrate higher than the temperature of the center of the transparent substrate. A heat transfer element installed along the corners of the transparent substrate, and a heater for supplying heat to the heat transfer element, may be used for heating the corners of the transparent substrate.

The plasma etching chamber according to the present invention includes the heat transfer element for maintaining the temperature of the corners of the transparent substrate higher than the temperature of the center of the transparent substrate. Thus, it is possible to form a shading layer having a uniform CD distribution over the entire photomask substrate. In addition, in the method for manufacturing a photomask according to the present invention, when etching the shading layer, the temperature of at least one portion of the edge of the transparent substrate is maintained higher than the temperature of the center of the transparent substrate by heating the at least one portion of the edge of the transparent substrate. Therefore, it is possible to form a shading layer pattern having a uniform CD distribution over the transparent substrate by increasing an etching rate for the shading layer at the edge of the transparent substrate.

BRIEF DESCRIPTION OF THE DRAWINGS

The above objects and advantages of the present invention will become more apparent by describing in detail a preferred embodiment thereof with reference to the attached drawings in which.

DETAILED DESCRIPTION OF THE PREFERRED EMBODIMENTS

The present invention may be embodied in many different forms and should not be construed as being limited to the present embodiment set forth herein. Rather, the embodiment is provided so that this disclosure will be thorough and complete, and will fully convey the concept of the invention to those skilled in the art. In the drawings, the thickness of layers and regions are exaggerated for clarity. It will also be understood that when a layer is referred to as being "on" another layer or substrate, it can be directly on the other layer or substrate, or intervening layers may also be present.

In general, as the temperature of a typical photoresist layer or a chrome layer increases, the etching rate increases. The present invention will overcome a problem with non-uniform distribution of critical dimension (CD) values throughout a photomask substrate using the above property.

Figure 1:
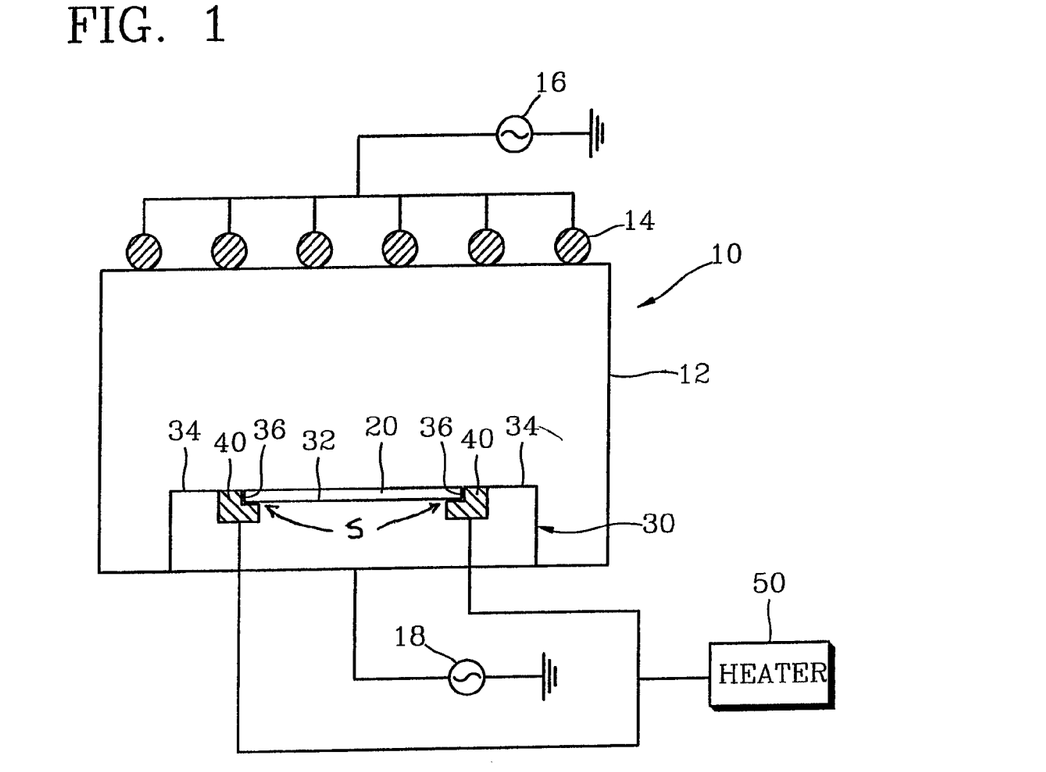
FIG. 1 is a schematic view of a plasma etching chamber according to a first embodiment of the present invention.

FIG. 1 is a schematic view illustrating the structure of a plasma etching chamber according to a first embodiment of the present invention. The plasma etching chamber may be installed in a transformer coupled plasma (TCP) etching apparatus, for example, or other suitable plasma etching chamber.

Referring to FIG. 1, a plasma etching chamber 10 includes a chamber wall 12, a TCP coil 14 installed on the chamber wall 12, and a first power source 16 for applying radio-frequency (RF) power to the TCP coil 14.

An electrode 30 for supporting a photomask substrate 20 is installed inside the plasma etching chamber 10. The electrode 30 includes a supporting surface 32 for supporting the photomask substrate 20 and a top surface 34 positioned outwardly of the supporting surface 32 and surrounding the supporting surface 32. Note, that in this embodiment of the electrode 30, the supporting surface 32 is recessed (or has a step difference) from the top surface 34, although in other embodiments it need not be. In other words, a horizontal plane comprising the supporting surface 32 is recessed from a horizontal plane comprising the top surface 34. In this recessed embodiment, a side wall 36 extends between the top surface 34 and the supporting surface 32 in the electrode 30, thereby forming a shoulder S on which the photomask substrate 20 rests.

A second power source 18 for applying radio-frequency (RF) power to the electrode 30 is connected to the bottom of the plasma etching chamber 10. The electrode 30 is installed so that the supporting surface 32 and top surface 34 face upward.

If an RF power is applied from the first power source 16 to the TCP coil 14, a magnetic field is formed around the TCP coil 14. As a result, magnetic field lines extend vertically downward into the inside of the plasma etching chamber 10. Then, an etching gas in the plasma etching chamber 10 is ionized by the magnetic field inside the plasma etching chamber 10, and plasma is generated due to the ionization of the etching gas. If an RF power is then applied from the second power source 18 connected to the electrode 30, plasma is attracted towards the photomask substrate 20 supported on the electrode 30. As a result, a layer deposited on the photomask substrate 20 is etched.

To obtain a uniform CD distribution of the photomask substrate 20 while etching the layer deposited on the photomask substrate 20, a heat transfer element 40 is installed near the edge of the supporting surface 32 of the electrode 30. The heat transfer element 40 is connected to a heater 50 for supplying heat to the heat transfer element 40.

As illustrated in FIG. 1, the heat transfer element 40 is preferably built into the electrode 30, in the shoulder area S of the electrode 30, thereby forming an L-shaped heat transfer element. In FIG. 1, the heat transfer element 40 is illustrated as being partially exposed at the peripheral edge of the supporting surface 32 on the electrode 30, the side wall 36, and the top surface 34 to effectively heat the edge of the photomask substrate 20. Since the exposed portion of the supporting surface 32 is very close to the bottom edge of the photomask substrate 20 and the side wall 36, the edge of the photomask substrate 20 can be effectively heated. However, if the heat transfer element 40 is installed only around the edge of the photomask substrate 20 in contact with the supporting surface 32, the heat transfer element 40 may be formed within the electrode 30 such that the heat transfer element 40 is not exposed on the top surface 34 of the electrode 30.

Figure 2:
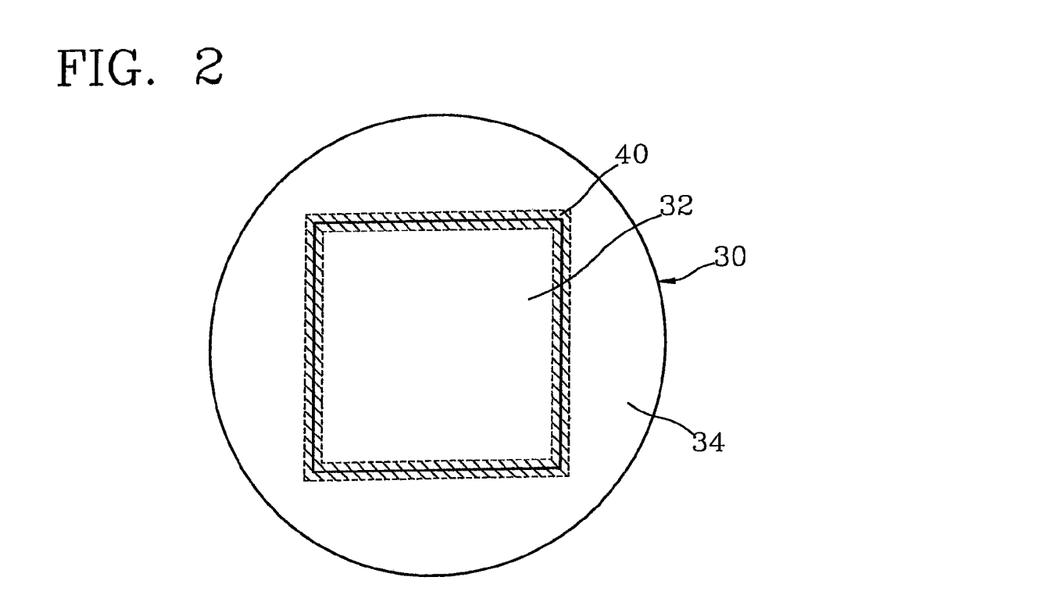
FIG. 2 is a top view of an electrode and a heat transfer element included in the plasma etching chamber according to the first embodiment of the present invention.

FIG. 2 is a top view illustrating the electrode 30 and the heat transfer element 40 built into the electrode 30 of FIG. 1. As viewed from above the electrode 30, the L-shaped heat transfer element 40 is installed to completely enclose the peripheral edge of the supporting surface 32, and extends from the edge of the supporting surface 32 to a certain width along the top surface 34.

Figure 3:
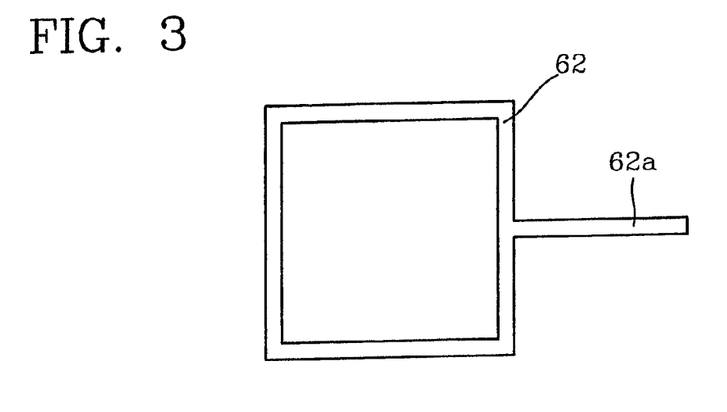
FIGS. 3 through 5 are views illustrating the detailed structure of different embodiments of a heat transfer element included in the plasma etching chamber according to the first embodiment of the present invention.
Figure 4:
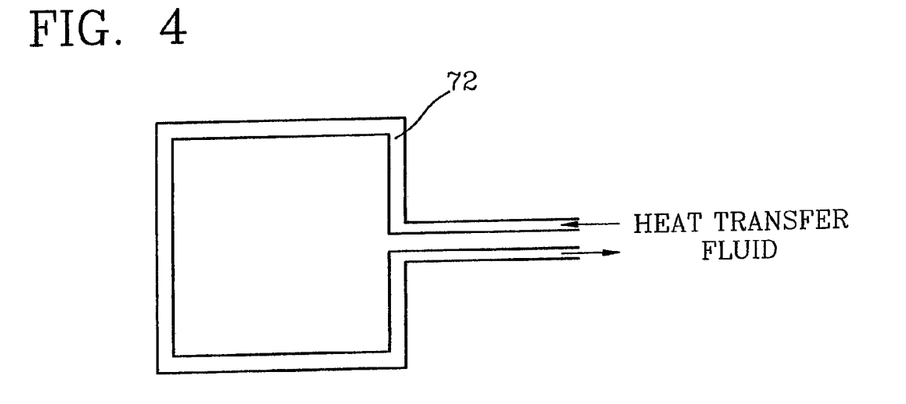
Figure 5:
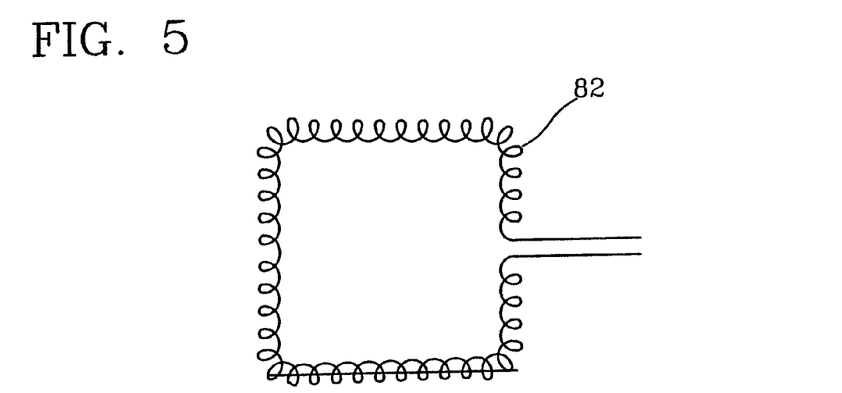

FIGS. 3 through 5 are views illustrating the detailed structure of alternate embodiments of the heat transfer element 40. Referring to FIG. 3, the heat transfer element 40 may be comprised of a metal line 62 having a high heat conductivity. The metal line 62 includes a connection unit 62a which is connected to the heater 50 to receive heat supplied from the heater 50.

Referring to FIG. 4, the heat transfer element 40 may include a pipe line 72 and heat transfer fluid flowing through the pipe line 72 for heating the pipe line 72. The heat transfer fluid may be oil or gas, and the fluid functions to transmit heat supplied from the heater 50 to the pipe line 72.

Referring to FIG. 5, the heat transfer element 40 may be comprised of a heating coil 82 in various configurations based on the desired heating profile, for example, edge heating, edge and side wall heating, or edge, side wall and top surface heating.

Since the plasma etching chamber 10 according to the first embodiment of the present invention includes the heat transfer element 40 for heating the edge of the photomask substrate 20, the edge of the photomask substrate 20 can be heated to a temperature higher than the temperature at the center of the photomask substrate 20, and thus an etching rate for a shading layer in an etching process for forming a shading layer pattern can be uniformly controlled on the entire photomask substrate 20. This is because as the temperature of a typical photoresist layer increases, the etching rate increases. As a result, it is possible to form the shading layer pattern to exhibit a uniform CD distribution over the entire photomask substrate 20.

Figure 6:
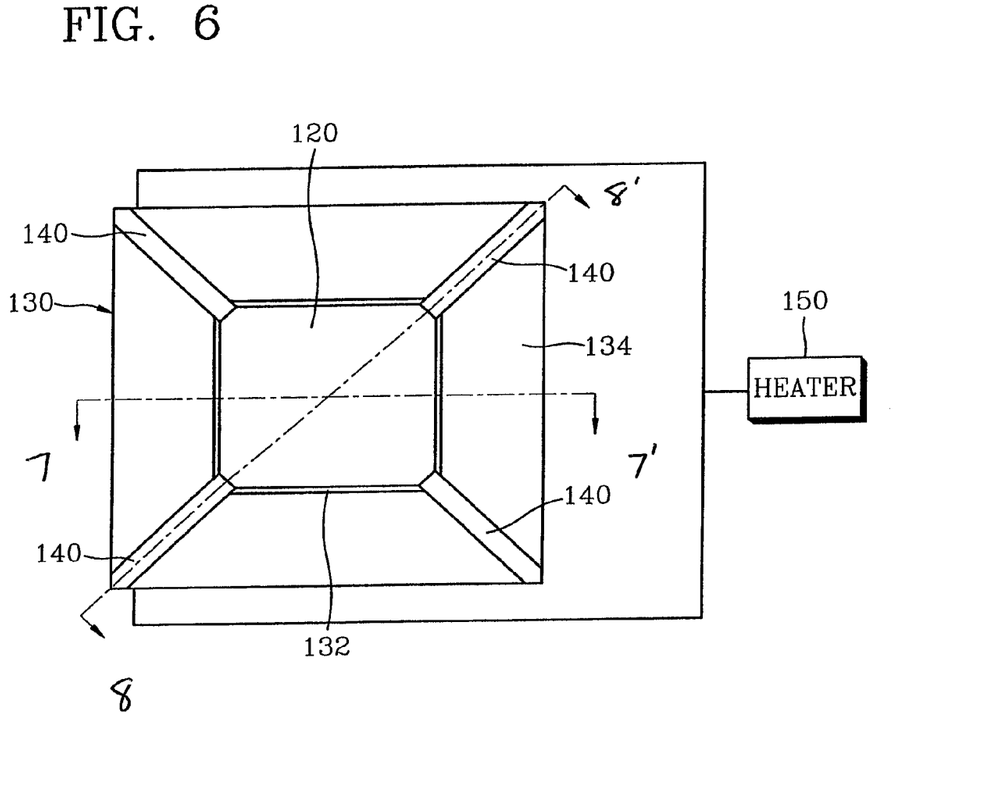
FIG. 6 is a top view illustrating the structure of a plasma etching chamber according to a second embodiment of the present invention.
Figure 7:
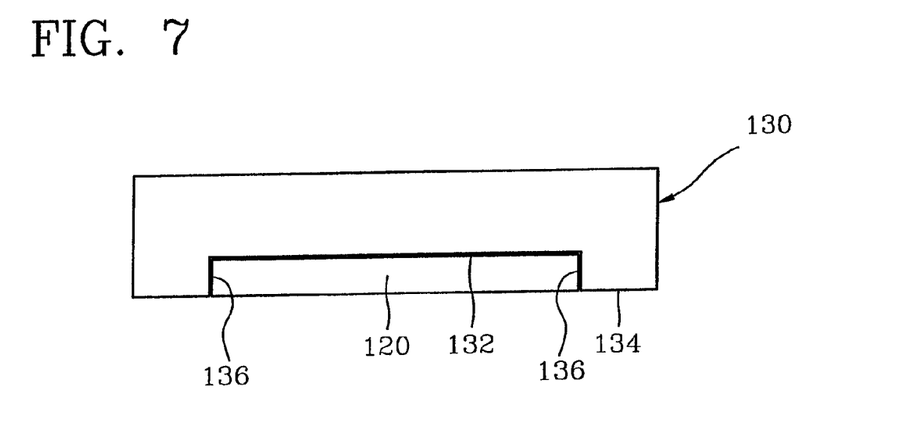
FIG. 7 is a cross-sectional view of an electrode of the plasma etching chamber according to the second embodiment of the present invention, taken along line 7-7' of FIG. 6.
Figure 8:
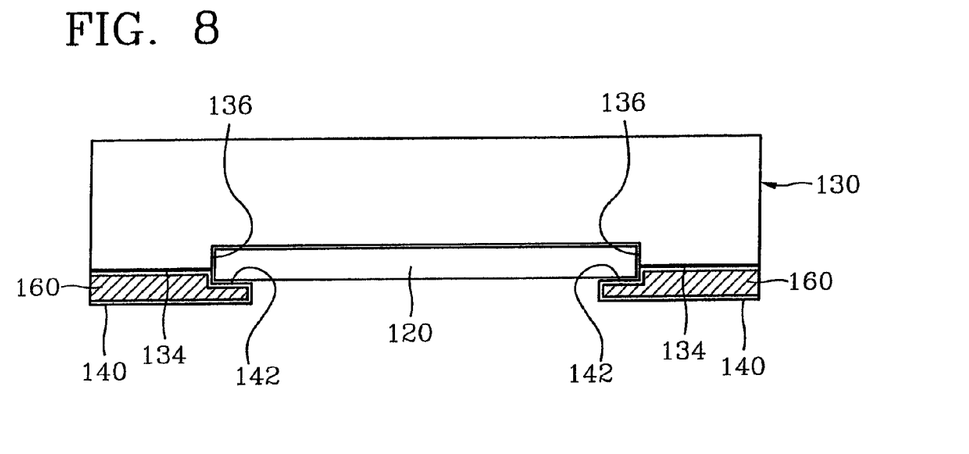
FIG. 8 is a cross-sectional view of the electrode of the plasma etching chamber according to a second embodiment of the present invention, taken along line 8-8' of FIG. 6.

FIG. 6 is a partial schematic top view illustrating the structure of a plasma etching chamber according to a second embodiment of the present invention. FIG. 7 is a cross-sectional view of the electrode 130 of the plasma etching chamber according to the second embodiment of the present invention, taken along line 7-7' of FIG. 6. FIG. 8 is an enlarged cross-sectional view of the electrode of the plasma etching chamber according to a second embodiment of the present invention, taken along line 8-8' of FIG. 6. The plasma etching chamber according to the second embodiment of the present invention may be included in an inductively coupled plasma (ICP) etching apparatus.

Referring to FIGS. 6 through 8, the electrode 130 shown in FIG. 6 is installed in a face-down type plasma etching chamber in which a top surface 134 of the electrode 130 faces downward. The plasma etching chamber includes a supporting surface 132 for supporting a photomask substrate 120. The electrode 130 including the top surface 134 surrounds the recessed (or stepped down) supporting surface 132. In this stepped down electrode configuration, a side wall 136 extends between the top surface 134 and the supporting surface 132.

A plurality of chucking pads 140 are installed below the electrode 130 as shown best in FIG. 8. The chucking pads 140 fix the photomask substrate 120 that is supported by the supporting surface. Each of the chucking pads 140 includes a contact surface 142 extending inwardly of the side walls 136 such that the chucking pads 140 and the corners of the photomask substrate 120 contact each other so that the photomask substrate 120 is fixed in place.

A heat transfer element 160 for heating the corners of the photomask substrate 120 is built into each of the chucking pads 140. The heat transfer element 160 receives heat supplied from a heater 150. The heat transfer element 160 may be comprised of metal, a heating coil, or other heating device embodiments as set forth in FIGS. 3-5.

Since the plasma etching chamber according to the second embodiment of the present invention includes the chucking pads 140 in which the heat transfer element 160 is installed, it is possible to effectively heat only the corners of the photomask substrate 120 showing a relatively large thickness of photoresist and a relatively small CD value along portions of the edge of the photomask substrate 120. Accordingly, the corners of the photomask substrate 120 can be heated to a temperature higher than the temperature at the center of the photomask substrate 120. Therefore, an etching rate for a shading layer in an etching process for forming a shading layer pattern can be uniformly controlled along the entire photomask substrate 120. As a result, it is possible to form the shading layer pattern having a uniform CD distribution over the entire photomask substrate 120.

Figure 9A:
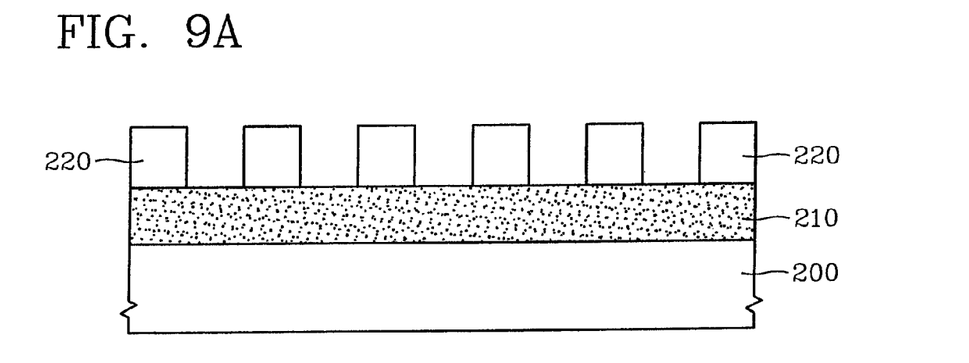
FIGS. 9A and 9B are cross-sectional views illustrating a method for manufacturing a photomask according to a preferred embodiment of the present invention.
Figure 9B:
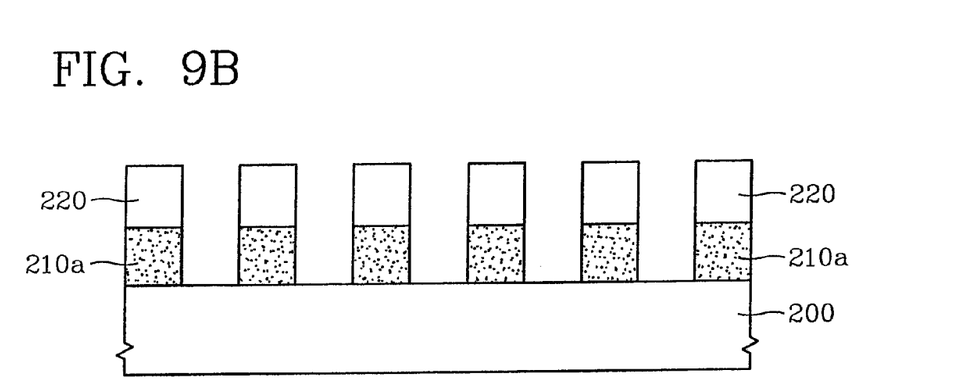

FIGS. 9A and 9B are cross-sectional views illustrating a method for manufacturing a photomask according to a preferred embodiment of the present invention.

Referring to FIG. 9A, a shading layer 210, such as a chrome layer, is formed on a transparent substrate 200, such as a quartz substrate. A photoresist layer pattern 220 is formed on the shading layer 210 to partially expose the shading layer 210. The photoresist layer pattern 220 may be an electron beam photoresist.

Referring to FIG. 9B, the shading layer 210 is etched by performing an etching process using plasma while using the photoresist layer pattern 220 as an etching mask under a state in which the temperature of at least a portion of the edge of the transparent substrate 200 is maintained higher than the temperature of the center of the transparent substrate 200, thus forming a uniform shading layer pattern 210a. Here, a typical plasma etching apparatus, such as a TCP etching apparatus or an ICP etching apparatus, may be used.

Figure 10:
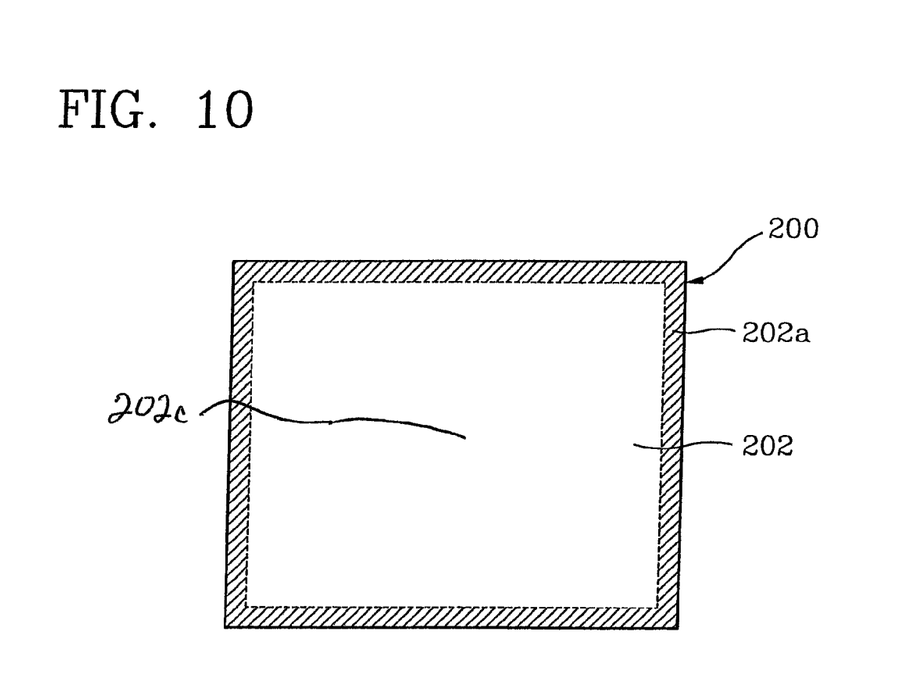
FIGS. 10 and 11 are views illustrating the bottom surface of a transparent substrate shown in FIGS. 9A and 9B.
Figure 11:
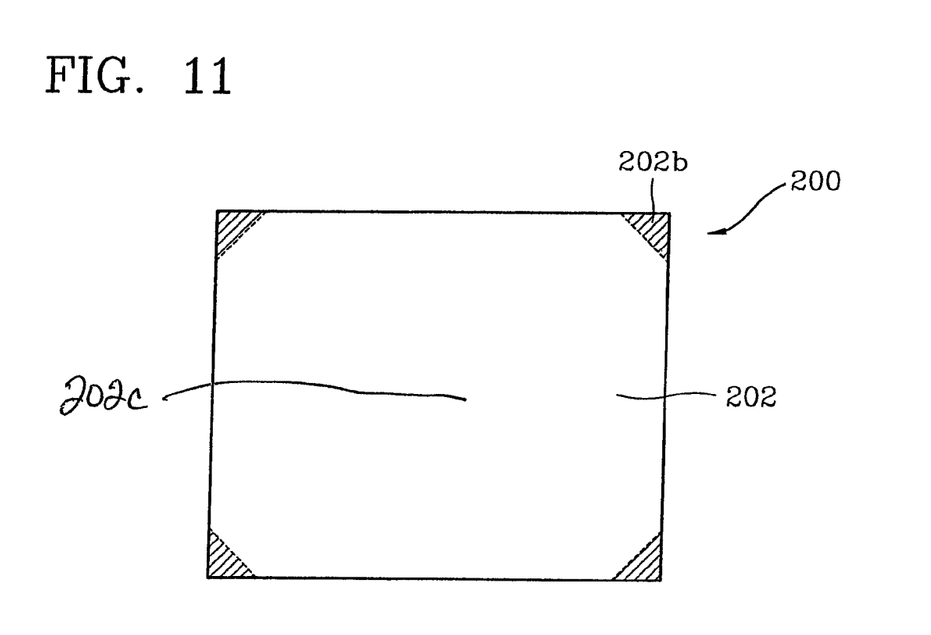

FIGS. 10 and 11 are views illustrating the bottom surface of the transparent substrate 200.

To maintain the temperature of a peripheral edge portion 202a of the transparent substrate 200 higher than the temperature of the center 202c of the transparent substrate 200 while etching the shading layer 210, only the edge portion 202a of the transparent substrate 200, which is denoted by the slanted lines in FIG. 10, is heated. The side walls of the transparent substrate 200 and the peripheral edge portion 202a can be heated at the same time. An etching apparatus including the plasma etching chamber 10, which has been described with reference to FIG. 1, may be used.

In addition, to maintain the temperature of corners 202b of the transparent substrate 200, at which CD values decrease considerably, among the peripheral edge portion 202a of the transparent substrate 200, higher than the temperature of the center 202c of the transparent substrate 200 while etching the shading layer 210, the corners 202b of the transparent substrate, which are denoted by the slanted lines in FIG. 11, can be heated. At this time, a plasma etching chamber including chucking pads, which has been described above with reference to FIG. 8, may be used.

As described above, an etching rate for the shading layer 210 at a peripheral edge portion or corners of the transparent substrate 200 can be enhanced by maintaining the temperature of at least a portion of the edge of the transparent substrate 200 higher than the temperature of the center of the transparent substrate 200 while etching the shading layer 210.

As a result, it is possible to obtain a shading layer pattern having a uniform CD distribution over the entire transparent substrate 200.

As described above, the plasma etching chamber according to the present invention includes a heat transfer element for maintaining the temperature of the edge of the photomask substrate higher than the temperature of the center of the photomask substrate by heating the edge or corners of the photomask substrate. Again, since the edge or corners of the photomask substrate can be heated to a higher temperature than the center of the photomask substrate, the etching rate for a shading layer can be controlled to ensure layer uniformity over the entire photomask substrate. As a result, it is possible to form a shading layer pattern having a uniform CD distribution over the entire photomask substrate.

In the method for manufacturing a photomask according to the present invention, before etching a shading layer, at least one portion of the edge of a transparent substrate is heated to a temperature higher than the temperature of the center of the transparent substrate. Thus, while etching the shading layer, an etching rate for the shading layer at the edge or corners of the transparent substrate can be enhanced. As a result, it is possible to form a shading layer pattern having a uniform CD distribution over the entire photomask substrate.

While this invention has been particularly shown and described with reference to preferred embodiments thereof, it will be understood by those skilled in the art that various changes in form and details may be made therein without departing from the spirit and scope of the invention as defined by the appended claims.

What is claimed is:

1. A method for manufacturing a photomask comprising:

forming a shading layer on a transparent substrate;

forming a photoresist layer pattern on the shading layer so as to partially expose the shading layer;

etching the shading layer using plasma to form a shading layer pattern, and using the photoresist layer pattern as an etching mask; and heating the transparent substrate, while etching, such that a temperature of at least one portion of a peripheral edge of the transparent substrate is maintained higher than a temperature of a center portion of the transparent substrate.

2. The method of claim 1, further comprising providing a transparent substrate formed of quartz.

3. The method of claim 1, further comprising providing a shading layer formed of chrome.

4. The method of claim 1, further comprising providing a photoresist layer pattern formed of an electron-beam photoresist.

5. The method of claim 1, wherein during the etching of the shading layer, the heating comprises heating a peripheral edge of the transparent substrate in order to maintain the temperature of the peripheral edge of the transparent substrate higher than the temperature of the center of the transparent substrate.

6. The method of claim 1, wherein during the etching of the shading layer, the heating comprises heating only a bottom edge of the transparent substrate in order to heat the peripheral edge of the transparent substrate.

7. The method of claim 1, wherein during the etching of the shading layer, the heating comprises heating a bottom edge and side walls of the transparent substrate in order to heat the peripheral edge of the transparent substrate.

8. The method of claim 1, wherein during the etching the shading layer, corner portions of the peripheral edge of the transparent substrate are heated in order to maintain the corners of the transparent substrate at a temperature higher than the temperature of the center of the transparent substrate.

* * * * *